United States Patent
Khater et al.

(10) Patent No.: US 6,459,066 B1
(45) Date of Patent: Oct. 1, 2002

(54) TRANSMISSION LINE BASED INDUCTIVELY COUPLED PLASMA SOURCE WITH STABLE IMPEDANCE

(75) Inventors: Marwan H. Khater, Poughkeepsie, NY (US); Lawrence J. Overzet, Plano, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/878,156

(22) Filed: Jun. 8, 2001

Related U.S. Application Data
(60) Provisional application No. 60/227,804, filed on Aug. 25, 2000.

(51) Int. Cl.[7] .............................................. B23K 10/00
(52) U.S. Cl. ............................ 219/121.41; 219/121.43; 118/723 I; 156/345
(58) Field of Search ........................ 219/121.41, 121.43, 219/121.44, 121.48; 315/111.51; 118/723 I, 723 R; 204/192.21; 156/345; 216/68

(56) References Cited

U.S. PATENT DOCUMENTS

| | | | |
|---|---|---|---|
| 4,747,922 A | 5/1988 | Sharp .................... 204/192.11 |
| 4,963,239 A | 10/1990 | Shimamura et al. ... 204/192.12 |
| 5,423,915 A | 6/1995 | Murata et al. ............... 118/723 |
| 5,435,886 A | 7/1995 | Fujiwara et al. ............ 156/643 |
| 5,436,172 A | 7/1995 | Moslehi ........................ 437/8 |
| 5,453,305 A | 9/1995 | Lee .............................. 427/562 |
| 5,467,013 A | 11/1995 | Williams et al. ............. 324/127 |
| 5,472,561 A | 12/1995 | Williams et al. ............. 156/627 |
| 5,510,011 A | 4/1996 | Okamura et al. ......... 204/192.3 |
| 5,540,824 A | 7/1996 | Yin et al. .................... 156/345 |
| 5,554,853 A | 9/1996 | Rose .......................... 250/492 |
| 5,558,718 A | 9/1996 | Leung .......................... 118/723 |
| 5,580,419 A | 12/1996 | Berenz ....................... 156/628 |
| 5,580,429 A | 12/1996 | Chan et al. .................. 204/192 |
| 5,607,509 A | 3/1997 | Schumacher et al. ....... 118/723 |
| 5,619,103 A | 4/1997 | Tobin et al. ................. 315/111 |
| 5,650,032 A | 7/1997 | Keller et al. ................ 156/345 |
| 5,683,548 A | 11/1997 | Hartig et al. ................ 156/643 |

(List continued on next page.)

OTHER PUBLICATIONS

Kanakasabapathy, Sivananda K., Overzet, Lawrence J., and Midha, Vikas and Economou, Demetre Alternating Fluxes of Positive and Negative Ions from Ion–Ion Plasma, University of Texas at Dallas, and University of Houston, 2000, pp1–8 and figures 1–3.

(List continued on next page.)

Primary Examiner—Mark Paschall
(74) Attorney, Agent, or Firm—Edwin S. Flores; Sanford E. Warren, Jr.; Gardere Wynne Sewell LLP

(57) ABSTRACT

A properly designed and positioned Faraday shield/dielectric spacer/source-coil assembly is used to nearly fix the input impedance of an Inductively Coupled Plasma (ICP) source-coil, making a variable matching network almost unnecessary, and allowing for pulsed plasma processing with very little reflected power. Further, the nearly constant input-impedance also means a nearly constant standing wave pattern on the ICP source-coil and constant power deposition symmetry as well as plasma uniformity independent of RF power, gas pressure and gas composition. This is not possible without a properly designed and positioned Faraday shield because the source-coil impedance is coupled to that of the plasma and changes significantly with the plasma conditions. The ICP source-coil/dielectric spacer/Faraday shield assembly can then be designed to optimize the symmetry of the plasma generation independent of plasma conditions by varying the source coil structure, dielectric spacer material, dielectric spacer structure, and Faraday shield structure. An appropriately positioned aperture in the Faraday shield can allow enough capacitive coupling between the vacuum and ICP source coil to ignite the plasma while preventing any significant capacitive coupling during the subsequent high-density ICP phase.

44 Claims, 10 Drawing Sheets

U.S. PATENT DOCUMENTS

| | | | |
|---|---|---|---|
| 5,728,261 A | 3/1998 | Wolfe et al. | 156/662.1 |
| 5,783,102 A | 7/1998 | Keller | 216/68 |
| 5,846,375 A | 12/1998 | Gilchrist et al. | 156/345 |
| 5,868,897 A | 2/1999 | Ohkawa | 156/345 |
| 5,968,377 A | 10/1999 | Yuasa et al. | 219/121.41 |
| 5,983,828 A | 11/1999 | Savas | 118/723 I |
| 6,028,285 A | 2/2000 | Khater et al. | 219/121 |
| 6,033,585 A * | 3/2000 | Wicker et al. | 216/68 |
| 6,197,165 B1 * | 3/2001 | Drewery | 294/192.12 |
| 6,312,555 B1 * | 11/2001 | Daviet | 156/345 |

OTHER PUBLICATIONS

Koromogawa, Takashi, Fujii, Takashi, Yamashita, Akihito, Horiike, Yasuhiro, and Shindo, Haruo, Negative Ion Assisted Silicon Oxidation in Downstream of Microwave Plasma, Tokai University, Hiratsuka, Japan and Toyo University, Kawagoe, Japan, 1998 Publication Board, Japanese Journal of Applied Physics, Part 1, No. 9A, Sep. 1998, Jpn. J. Appl. Phys. vol. 37 (1998) pp5028–5032.

Samukawa, Seiji, Highly Selective and Highly Anisotropic $SiO_2$ Etching in Pulse–Time Modulated Electron Cyclotron Resonance Plasma, NEC Corporation, Ibaraki, Japan, Part 1, No. 4B, Apr. 1994, Jpn. J. Appl. Phys. vol. 33 (1994) pp2133–2138.

Ohtake, Hiroto and Samukawa, Seiji, Charge–free etching process using positive and negative ions in pulse–time modulated electron cyclotron resonance plasma with low–frequency bias, NEC Corporation, Ibaraki, Japan Appl. Phys. Lett. 68 (17), Apr. 22, 1996, pp2416–2417.

Ahn, Tae Hyuk, Nakamura, Keiji and Sugai, Hideo, A New Technology for Negative Ion Detection and the Rapid Electron Cooling in a Pusled High–Density Etching Plasma, Nagoya University, Nagoya, Japan, Part 2, No. 10B, Oct. 15, 1995, Jpn. J. Appl. Phys. vol. 34 (1995) pp L1405–L1408.

Hashimoto, Koichi, Hikosaka, Yukinobu, Hasegawa, Akihiro and Nakamura, Moritaka, Reduction of Electron Shading Damage Using Synchronous Bias in Pulsed Plasma, Fujitsu Limited, Kawaski, Japan, Part 1, No. 6A, Jun. 1996, Jpn. Appl. Phys. vol. 35 (1996) pp3363–3368.

Overzet, L.J. and Luo, L., Negative and positive ions from radio frequency plasmas in boron trichloride, University of Texas at Dallas, Appl. Phys. Lett. 59 (2), Jul. 8, 1991, pp161–163.

Samukawa, Seiji and Terada, Kazuo, Pulse–time modulated electron cyclotron resonance plasma etching for highly selective, highly anistropic, and less–charging polycrystalline silicon patterning, NEC Corporation, Ibaraki, Japan, J. Vac. Sci. technol. B 12(6), Nov./Dec. 1994, pp3300–3305.

Samukawa, Seji, Pulse–time modulated electron cyclotron resonance plasma etching with low radio–frequency substrate bias, NEC Corporation, Ibaraki, Japan, Appl. Phys. Lett., vol. 68, No. 3, Jan. 15, 1996, pp316–318.

Overzet, L.J., Beberman, J.H. and Verdeyen, J.T., Enhancement of negative ion flux to surfaces from radio–frequency processing discharges, University of Illinois, J. Appl. Phys. 66 (4), Aug. 15, 1989, pp1622–1631.

* cited by examiner

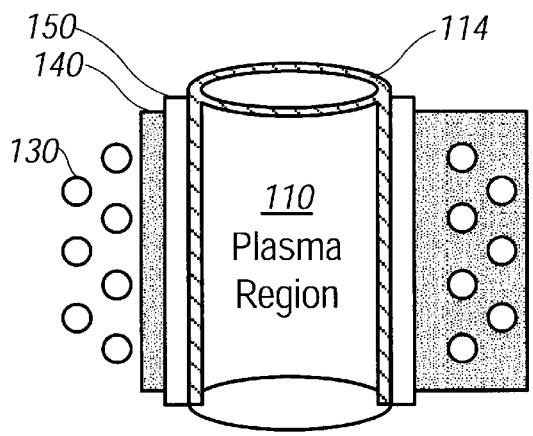
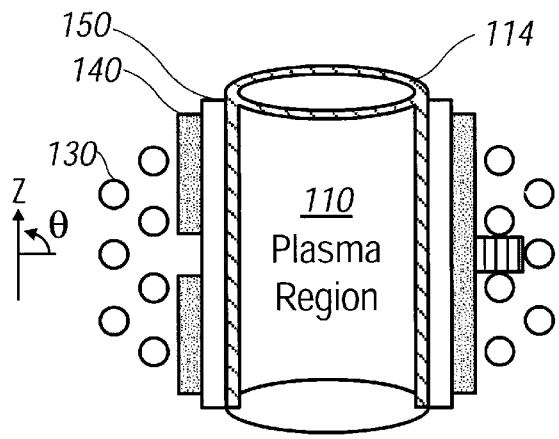
FIG. 4a  FIG. 4b
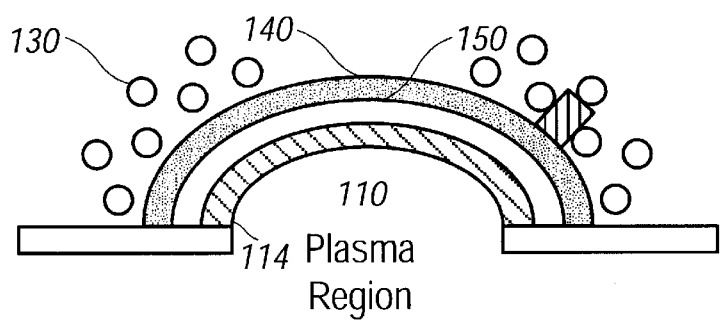
FIG. 4c

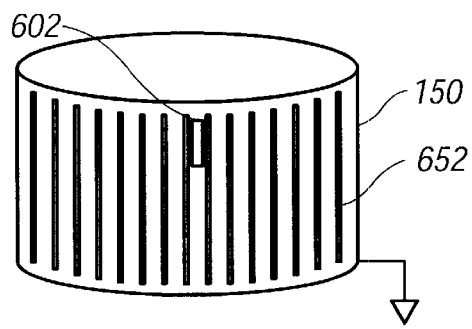
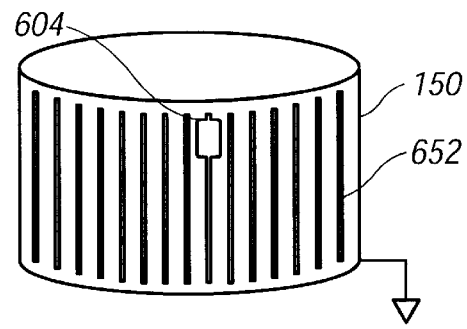
*FIG.6a*  *FIG.6b*
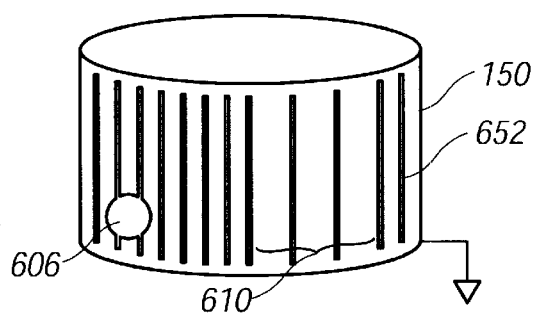
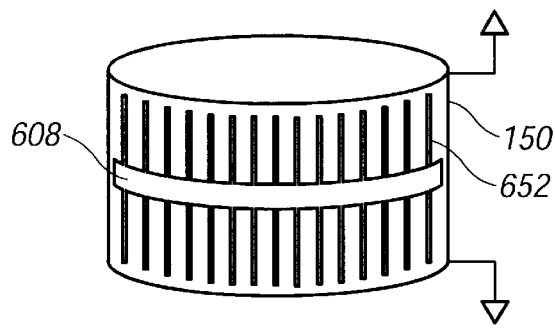
*FIG.6c*  *FIG.6d*

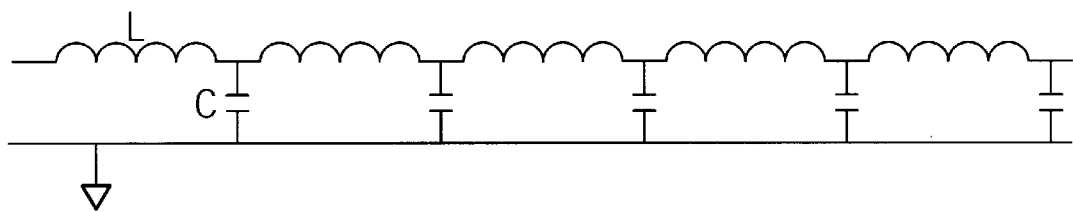
FIG. 8a
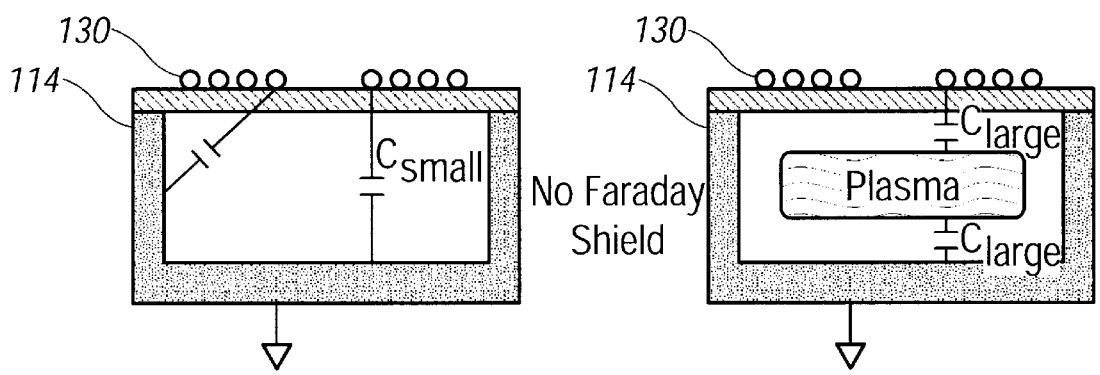
FIG. 8b   FIG. 8c
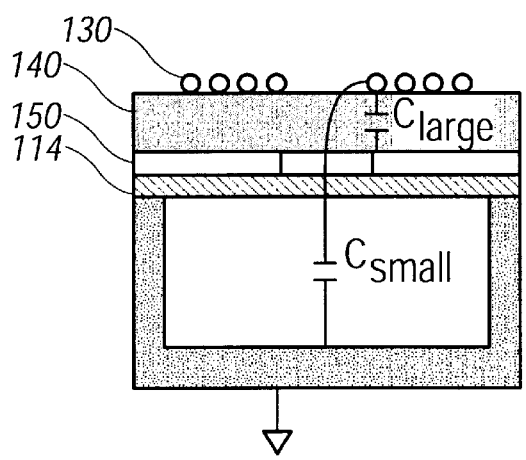 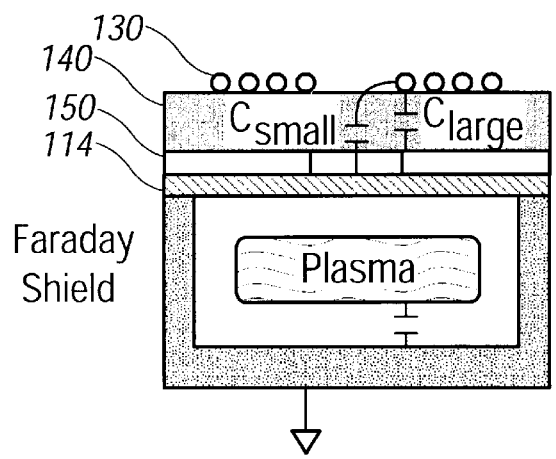
FIG. 8d   FIG. 8e

TRANSMISSION LINE BASED INDUCTIVELY COUPLED PLASMA SOURCE WITH STABLE IMPEDANCE

CROSS-REFERENCE TO OTHER APPLICATIONS

This application claims priority from US provisional application 60/227,804 filed Aug. 25, 2000, which is hereby incorporated by reference.

BACKGROUND AND SUMMARY OF THE INVENTION

The present invention relates to plasma-processing sources, systems, and methods, and particularly to inductively-coupled plasma source architectures.

Standing waves unavoidably develop on inductively coupled plasma (ICP) sources because they are mismatched transmission line systems. In addition, the source electrical properties are coupled to those of the plasma, since the source-plasma system behaves similar to a transformer. As a result, the source input impedance and the RF wavelength on the source can be substantially affected by the very plasma conditions it generates. This can also influence the symmetry of the source electromagnetic fields and plasma generation, which in turn will influence the uniformity of the plasma and the ion flux to the wafer surface.

Inductively coupled plasmas behave like an air-core transformer with the inductive source-coil as the primary circuit and the plasma as the secondary (single current loop) circuit. The coil impedance is coupled to that of the plasma and changes with the plasma conductivity, which determines the plasma resistance and reactance, causing changes in the electrical characteristics of the inductive coil. The effect of plasma loading on the coil's voltage, current and phase shift in argon discharges has been studied using transformer theory. (See Piejak 1992, Godyak 1994, Gudmundsson 1997, Gudmundsson 1998, Fayoumi 1997, and Fayoumi 1998, cited below.) Changes in the electrical characteristics of the coil due to plasma loading affect its electromagnetic fields, which largely determine the plasma generation symmetry and process uniformity. Understanding the interaction between the coil's fields and the plasma is essential for inductive source design and scaling in order to optimize plasma process uniformity. Gudmundsson et al. (Gudmundsson 1998) modeled and measured the changes in the source-coil's resistance and reactance at 13.56 MHz caused by plasma loading. El-Fayoumi et al. (Fayoumi 1997, Fayoumi 1998) measured the current induced in argon plasmas generated with a low frequency ICP source-coil. They calculated the plasma resistance and inductance from the induced plasma current and studied their effects on the coupling constant with the coil and its electrical properties.

Most studies have considered the coil's voltage and current to be spatially averaged and did not take into account the effect of plasma loading on the standing wave pattern that unavoidably develops on ICP sources. Transmission line properties of an ICP source result in voltage and current standing waves along its length. The variations in current with position lead to asymmetries in the induced electromagnetic fields, which in turn can lead to asymmetries in the power deposition, plasma generation and non-uniformity in the processing. (Jaeger 1995, Kushner 1996, Lamm 1997) A three-dimensional model by Kushner et al. (Kushner 1996) showed that the transmission line properties of the coil should influence the power deposition symmetry as well as the ion flux uniformity to the wafer surface. They examined the effect of capacitive termination impedance and coil geometry on the standing wave pattern and power deposition symmetry. In a related study, Lamm 1997, an ICP was modeled as a uniform transmission line system. Lamm made measurements of the standing wave for different source geometries and powers from which he derived analytical expressions for the spatial variations of the voltage and current along the coil length. More recently, Wu et al. (Wu 2000) investigated the influence of source configuration and standing wave effects on argon discharge density profiles generated with a large area ICP source. They modeled the inductive discharge as a lossy transmission line system and applied a transformer model to study the electrical properties of the system. In addition to a matching network, they used a tuning network to launch a traveling wave or a wave with a desired standing wave ratio along the source length. Their experiments showed that the source configuration and standing wave ratio could strongly influence the plasma density profile. Changes in the standing wave pattern on a new ICP source design caused by changes in plasma loading for argon and chlorine discharges have been reported recently by the inventors (Khater 2000, Khater 2001). The voltage and current variations along the coil's length, as well as the phase difference between them, are determined by the coil's characteristic impedance. Since plasma loading changes the coil's characteristic impedance, the standing wave pattern will also change depending on the plasma conditions. As a result, the plasma generation symmetry and uniformity for a fixed ICP source geometry changes as the plasma conditions are varied. This effect should be considered in the design of ICP sources as they are scaled to large sizes for processing large area substrates.

A Faraday shield can be used to minimize these deleterious effects if properly designed and positioned. To date, Faraday shields have been used simply to decrease capacitive coupling between the source and the plasma and reduce sputtering of the dielectric window. Faraday shields have been used in this fashion for at least several decades. A dielectric spacer is placed between the source and the Faraday shield to provide electrical insulation. In most cases, air is chosen to be the dielectric because air has the lowest relative permittivity and results in the smallest standing-wave variation on the source. The present application teaches that a "source-coil/dielectric spacer/Faraday shield" assembly acts as a transmission line with a nearly fixed characteristic impedance and standing wave pattern on the source-coil. In this manner, the source impedance is made stable regardless of plasma conditions since the Faraday shield decouples the source-coil electrical properties from those of the plasma. The key to designing this ICP source-coil/dielectric spacer/Faraday shield assembly is to ensure that the impedance between the shield and ICP source-coil dominates over the impedance between the ICP source-coil and plasma. When this is the case, changes in the plasma characteristics can cause little or no variation in the total ICP source-coil impedance and therefore become negligible. As a result, the standing wave pattern on the ICP source-coil becomes constant, as does the input impedance and plasma generation symmetry.

Such an assembly has important implications for plasma system design and optimization. For example, the use of this type assembly allows any ICP source to be impedance matched by a nearly fixed matching circuit. The possibility of a fixed matching condition will allow much simpler plasma control in addition to easily allowing for pulsed plasma processing with very little reflected power. This has been demonstrated experimentally (Khater 2001). In addition, once the source geometry is optimized for symmetric electromagnetic fields and plasma uniformity with a fixed standing wave pattern, it should stay uniform regardless of the plasma conditions. Optimizing the structure of the dielectric spacer (materials, shape) and Faraday shield structure in addition to the source-coil geometry is important in optimizing the electromagnetic field symmetry.

Finally, a calibrated aperture in the center, at the edge, or at some other location in the Faraday shield can be designed to allow a small amount of capacitive coupling to the plasma for striking the discharge. Once a high-density plasma forms, it will expel this capacitive coupled field and result in an inductively coupled plasma. Consequently, the source will both strike reliably and result in very little window sputtering or other deleterious effects. In addition, the Faraday shield/dielectric spacer/source-coil assembly will still prevent the plasma from changing the source-coil standing wave pattern, input impedance, and fields symmetries.

Transmission Line Based Inductively Coupled Plasma Source with Stable Impedance

The present inventors have realized that the Faraday shield/dielectric spacer/source-coil assembly provides a fundamental change in the electrical characteristics of the coil which drives the plasma, and that this change permits new techniques for operating an inductively-coupled plasma reactor. Without a Faraday shield, the RF behavior of the coil is determined by the state of the chamber's interior, which varies dynamically. The complex impedance of the coil changes dramatically when the plasma is ignited, but also is dependent on other factors, such as pressure, which affect the electron density of the plasma. Since the coil is electrically coupled to the plasma, changes in the electron density of the plasma also change the complex impedance of the coil.

With the Faraday shield, capacitive coupling between the coil and the plasma is largely removed. The present inventors have realized that this makes the coil's complex impedance much more independent of changes in the electron density of the plasma, and that this is very beneficial in optimizing the uniformity and controllability of the plasma source. Conventional ICP systems must allow for a large shift in complex impedance. One result of this is that conventional systems must use automatic matching networks which can adapt to large changes in the magnitude of impedance, e.g. over a range of ten to one.

The electrical behavior of an inductive source-coil is that of a transmission line, which forms the primary of a transformer. The transformer's secondary is the loop of current that flows in the plasma. Conventional wisdom is that current nodes must generally be avoided on the source-coil. A current node on a transmission line will result in the appearance of voltage antinodes, i.e. locations where the voltage has a much larger magnitude than at other parts of the transmission line. This can result in increased erosion of the dielectric shield at such points. (A "node," analogously, is a location where the current or voltage is lower than at adjacent positions.) Moreover, the current distribution will be very non-uniform under such conditions, and this can result in hot spots, at unpredictable locations in the plasma, which cause non-uniformities in the wafer processing. The present inventors have realized that the use of a three-dimensional source-coil design coupled with the Faraday shield can allow one to circumvent conventional wisdom. One can place current nodes on the source-coil without causing hot spots and still produce symmetric, uniform plasma. The ability to have current nodes on the source-coil, however, allows one to produce uniform plasma over much larger areas.

In one class of embodiments, the decoupling effect of the Faraday shield is used to permit operation of the coil in resonant or near-resonant conditions. Since the coil is decoupled from the variations in the plasma electron density, the location of voltage and current antinodes is less likely to shift unpredictably. Moreover, since the current distribution in the coil is now more predictable, the geometry of the coil can be modified to increase the uniformity of power deposited into the plasma.

In a further class of embodiments this idea is taken even farther, and the coil, supporting dielectric, and Faraday shield are all jointly optimized for plasma uniformity.

BRIEF DESCRIPTION OF THE DRAWING

The disclosed inventions will be described with reference to the accompanying drawings, which show important sample embodiments of the invention and which are incorporated in the specification hereof by reference, wherein:

FIGS. 4(*a*) and 4(*b*) show sample embodiments of a transmission line inductive plasma source with different examples of dielectric spacer cross-section for a primarily cylindrical source, and FIG. 4(*c*) shows an example of the dielectric spacer cross-section for a domed source. Those skilled in the art will realize that all the variation possibilities exemplified in the various FIG. 2 and FIG. 3 embodiments will also apply to the FIG. 4 embodiments.

FIGS. 6(*a*) through 6(*d*) show several different examples of a Faraday shield that can allow enough capacitive coupling for plasma ignition while preserving the transmission line source impedance as a near constant for a substantially cylindrical configuration.

In FIG. 7(*a*), with no plasma present, fields penetrate into the chamber 110. In FIG. 7(*b*), with plasma present, the fields are largely excluded from the chamber and nearly all the potential drop occurs within the dielectric window 114.

FIG. 8(*a*) shows a loss-less transmission line circuit model, consisting of a distributed series inductance and a distributed shunt capacitance, for the source assembly. FIGS. 8(b) through 8(e) show how this model corresponds to the various physical elements of the plasma reactor, in various configurations and conditions. The shunt capacitance is determined by the source-coil assembly and plasma conductivity. It becomes larger when the plasma is present without a Faraday shield but is largely unaffected by the presence of plasma when the Faraday shield is present.

DETAILED DESCRIPTION OF THE PREFERRED EMBODIMENTS

The numerous innovative teachings of the present application will be described with particular reference to the presently preferred embodiment (by way of example, and not of limitation).

Figure 1:
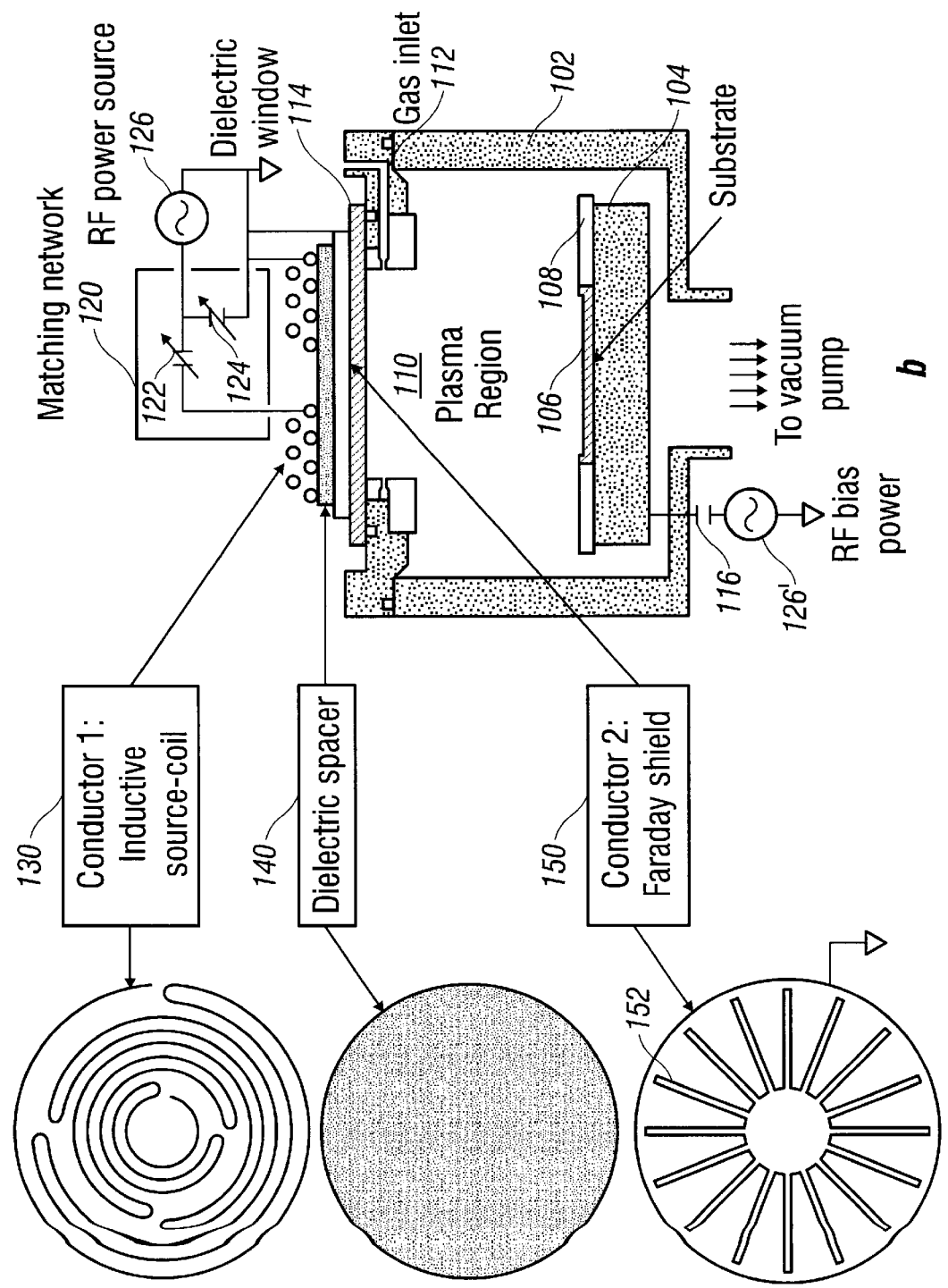
FIG. 1 shows a transmission line inductive plasma source: the left side (part a) shows an exploded view of major components of the source, and the right side (part b) shows a complete plasma-processing reactor which includes this source.

FIG. 1 shows a transmission line inductive plasma source (TLICP): the left side (part a) shows an exploded view of major components of the source, and the right side (part b) shows a complete plasma-processing reactor which includes this source. Major components shown include the inductive source-coil 130, dielectric spacer 140 and Faraday shield 150.

The TLICP source coil 130 is shown with a complex geometry like that described in U.S. Pat. No. 6,028,285 of Khater, Overzet and Cherrington. The illustrated source-coil design consists of two layers of loops separated by a few centimeters. The bottom layer loops are complete circles and are shown as thin lines. The top layer loops are ¾ of a circle (except for the outer most loop which is a full circle), and are shown as thick lines. Plasmas in a wide variety of gases and mixtures have been generated at pressures between 1–500 mTorr and powers up to 1000 W using this source (Khater 2000, Khater 2001).

The dielectric spacer 140 can consist of any number of materials including but not limited to carbon based materials like Teflon®, ceramics like alumina, air or other gases/vapors, and dielectric liquids. The primary purpose of the dielectric insulator to date has been to prevent arcing from the source coil to the Faraday shield 150. In the present invention, the dielectric is structured to produce uniform plasma generation by controlling the transmission-line characteristic-impedance along the source-coil in addition to acting as simple insulation.

The Faraday shield 150 generally consists of a good conductor with anti-eddy-current slots 152. The slots 152 can vary in number and dimension, but it has been found that 16 slots in a circular arrangement of 1/16" width works well for primarily planar source-coils up to 10" in diameter. The number of slots generally lies between 4 and 64. The slot width generally lies between 1/64" and ¼".

Part (b) of FIG. 1 shows the TLICP source assembly (130, 140 and 150) installed on a plasma-processing reactor. (The reactor shown is simply a generic reactor, and many other reactor configurations can be used.) The TLICP source generates plasma in the plasma region 110. It has an RF power source 126 connected to it through a matching network 120 consisting of primarily reactive components 122 and 124. In this example the reactive elements shown (122 and 124) are both variable capacitances (as is customary for Inductively Coupled Plasma sources), but fixed capacitances and/or fixed or variable inductances and transformers can all be used. Typical frequencies of the RF power lie between about 100 kHz and 100 MHz. The assembly sits on a dielectric window 114, which allows the electric and magnetic fields produced by the TLICP source assembly to enter the plasma region 110 while also providing a vacuum seal. A gas inlet 112 allows calibrated amounts of gas to enter the plasma region 110. The plasma region 110 is bounded by a vacuum vessel 102 and by a chuck assembly 104 holding a work piece 106 for processing using either a clamp 108 or some other mechanism. (Other mechanisms might include electrostatic clamping or gravity.) The chuck assembly can have power applied to it. Either DC power or RF power 126' can be applied to the chuck assembly through a matching network, a simple capacitance 116, or a direct connection.

Figure 2A:
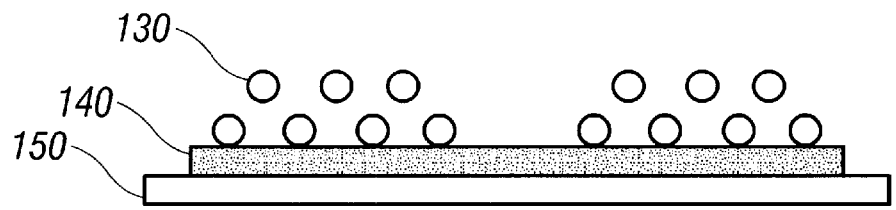
FIGS. 2(*a*) through 2(*f*) show six sample embodiments where a transmission line inductive plasma source 130 is combined with different examples of dielectric spacer 140 cross-section for a primarily planar source configuration.
Figure 2B:
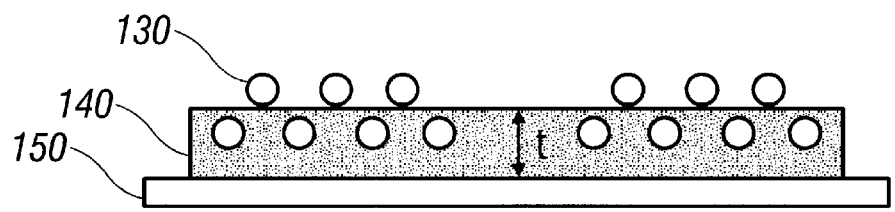
Figure 2C:
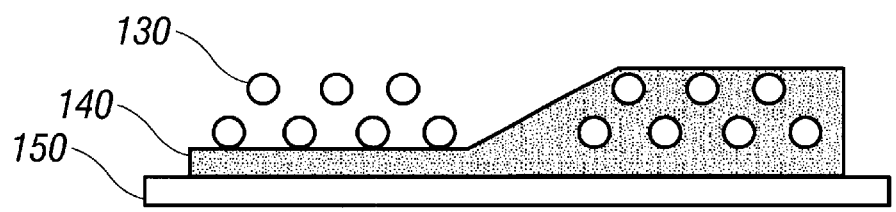
Figure 2D:
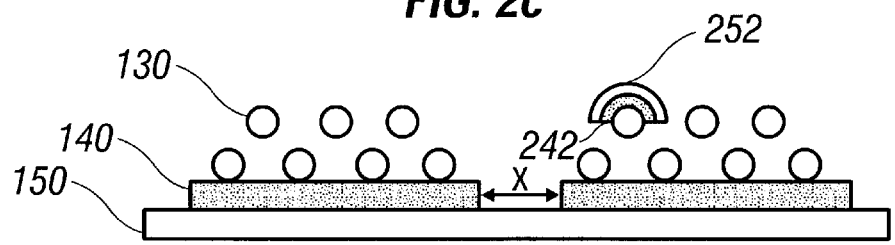
Figure 2E:
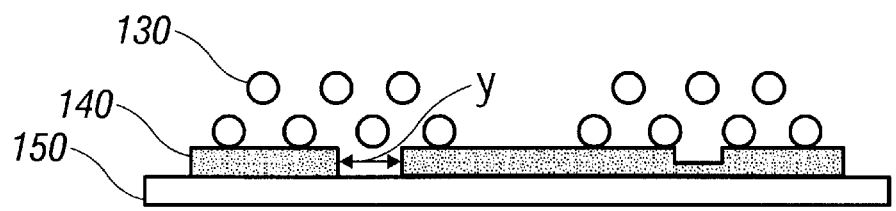
Figure 2F:
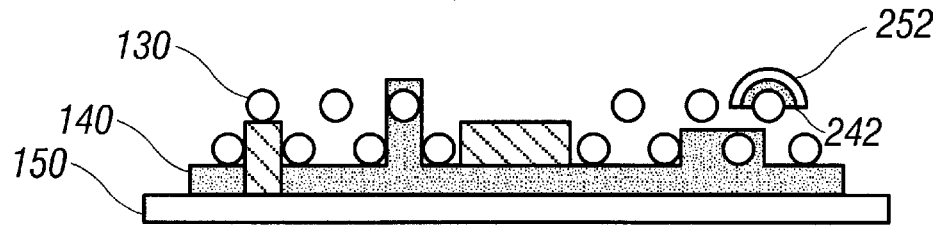
Figure 3A:
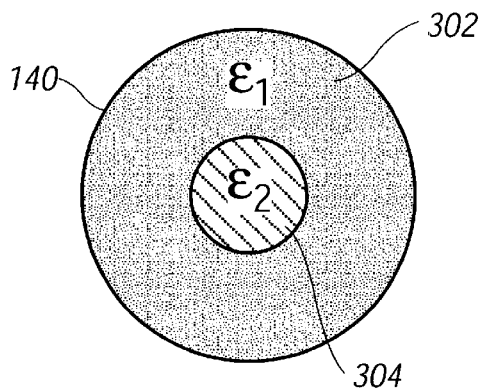
FIGS. 3(*a*) through 3(*d*) show four sample embodiments where the dielectric spacer 140 is implemented with different materials as part of its structure. Although only three dielectrics are delineated here, those skilled in the art will recognize that any number of different materials can be used. Although the dielectric spacer is drawn for the primarily planar configurations of the FIG. 2 embodiments, those skilled in the art will realize that the same kinds of variations can be applied to the cylindrical and domed assemblies of the FIG. 4 embodiments as well.
Figure 3B:
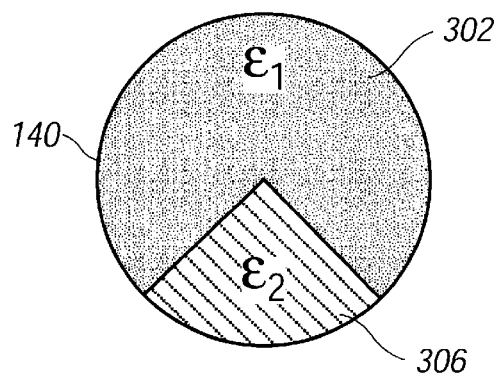
Figure 3C:
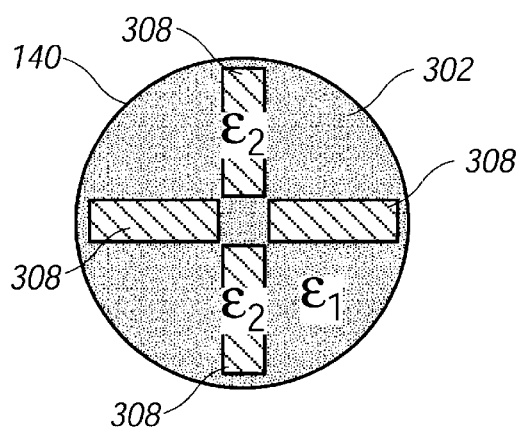
Figure 3D:
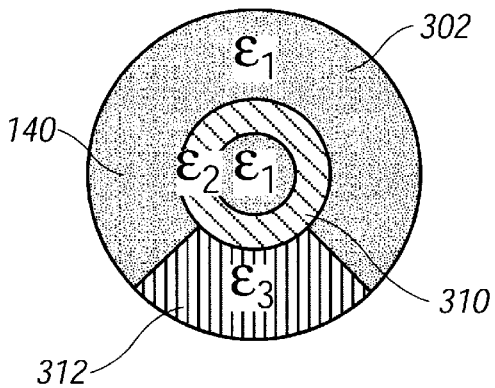

FIGS. 2(a) through 2(f) show six sample embodiments where a transmission line inductive plasma source 130 is combined with different examples of dielectric spacer 140 cross-section for a primarily planar source configuration. In various embodiments the source-coil 130 either lies on top of, partially inside of and/or completely inside of a dielectric spacer 140, which in turn lies on top of a Faraday shield 150. The dielectric spacer 140 can be made of any number of materials including but not limited to Teflon®, alumina, air or other gases/vapors, and dielectric liquids. The dielectric spacer can be a uniform layer of thickness "t" as shown in FIGS. 2(a) and 2(b). It can also have a wide variety of structural elements including a varying thickness (FIG. 2(c)); a central opening (circular, rectangular, etc.) of major dimension x shown in FIG. 2(d); openings of major dimension y placed either under a source-coil element or between source-coil elements shown in FIG. 2(e); recesses shown in FIG. 2(e); and stacks of materials or combinations of the above shown in FIG. 2(f). In addition, the structural elements can include a ground shield 252 placed in close proximity to a section of the source-coil with a dielectric spacer 242 between the ground shield 252 and source-coil shown in FIG. 2(d) and 2(f). The structure of the dielectrics (140, 242) and coil 130 are designed together to optimize the desired properties of the full assembly.

FIGS. 3(a) through 3(d) show top views of four sample embodiments where the dielectric spacer 140 is implemented with different materials as part of its structure. Although only three dielectrics are delineated here, those skilled in the art will recognize that any number of different materials can be used. Although the dielectric spacer is drawn for the primarily planar configurations of the FIG. 2 embodiments, those skilled in the art will realize that the same kinds of variations can be applied to the cylindrical and domed assemblies of the FIG. 4 embodiments as well.

In the various FIG. 3 embodiments, several modifications of the dielectric spacer 140 are shown for a primarily planar source coil configuration. Multiple dielectric materials can be used to optimize the transmission line properties of the TLICP assembly. Those skilled in the art will recognize that a central dielectric 304 with different permittivity from the remaining material of the dielectric spacer 302 can prove beneficial for striking plasma as one example. Either the central dielectric 304 or the circular dielectric 302 can also be a material with limited conductivity. In a second example, an arc of the circular dielectric spacer 140 can be made from another dielectric material 306 in order to optimize plasma generation uniformity. In another example, support structures for the coil can be made of one dielectric material 308 while the remainder of the spacer is made of another 302. This includes dielectric support structures 308 in air 302 but is not limited to such a choice of the materials. Another example of a complex interleaving and stacking of multiple dielectric materials 302, 310, and 312 is shown in FIG. 3(d). The structure of the dielectric and coil are designed together to optimize the desired properties of the system.

FIGS. 4(a) and 4(b) show sample embodiments of a transmission line inductive plasma source with different examples of dielectric spacer cross-section for a primarily cylindrical source, and FIG. 4(c) shows an example of the dielectric spacer cross-section for a domed source. Those skilled in the art will realize that all the variation possibilities exemplified in the various FIG. 2 and FIG. 3 embodiments will also apply to the FIG. 4 embodiments, and all of the examples used to describe the possibilities for a primarily planar configuration can also be applied to cylindrical, domed, conical and hemispherical configurations as well. Those skilled in the art will recognize that there may be slight differences between each configuration caused by the change of symmetry for each coordinate system (Cartesian (x-y) to polar (r-theta) to cylindrical (z-theta) to spherical (theta-phi)), but that the concepts demonstrated for the Cartesian and polar coordinates also apply for other coordinate systems.

Figure 5A:
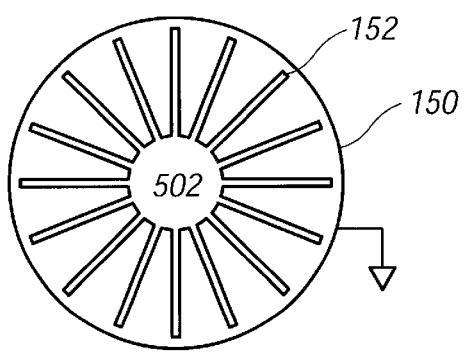
FIGS. 5(*a*) through 5(*d*) show several different examples of the Faraday shield that can allow enough capacitive coupling for plasma ignition while preserving the transmission line source impedance as a near constant for a planar configuration.
Figure 5B:
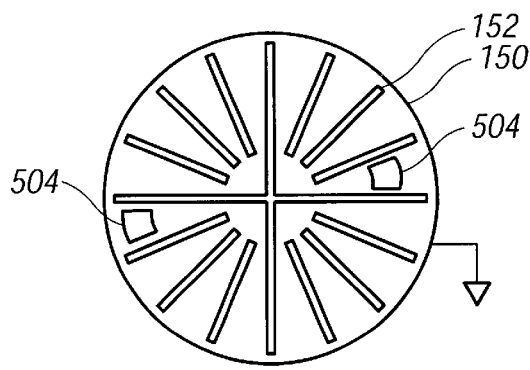
Figure 5C:
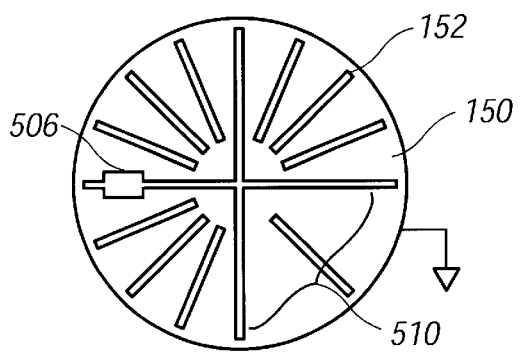
Figure 5D:
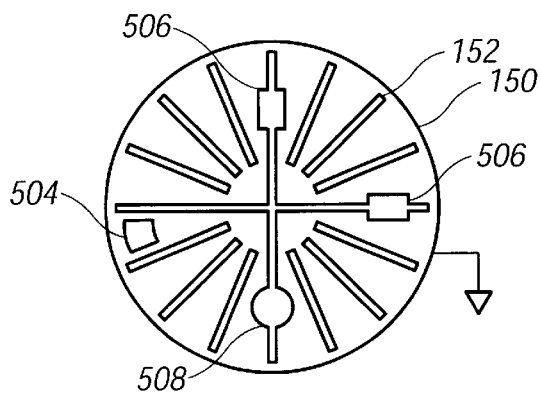

FIGS. 5(a) through 5(d) show several different examples of the Faraday shield 150 that can allow enough capacitive coupling for plasma ignition while maintaining the transmission line source impedance nearly constant. The FIG. 5 diagrams are for a primarily planar configuration, but the concepts demonstrated in these embodiments can easily be applied to other coordinate systems by those skilled in the art. The Faraday shield 150 has radial anti eddy-current slots 152 cut into it to match the radial symmetry assumed for the primarily planar source coil 130 of FIG. 1. The slots are cut substantially perpendicular to the direction of current flow in the source-coil, and prevent the Faraday shield from blocking the RF electromagnetic fields generated by those currents. One can also envision a non-uniform density of anti eddy-current slots 510, e.g. as shown in FIG. 5(c), in order to improve the electromagnetic field symmetry of a non-uniform source-coil.

A central opening 502 can also be made that allows the plasma to ignite by stray "capacitive" electric fields. These fields are generated by the large voltages on the source-coil, which the Faraday shield would ordinarily block from the plasma region 110 were not the central opening 502 present. Other kinds of openings can also be used to allow the plasma to strike, e.g. as shown in FIG. 5(b), (c) and (d): for example a radial arc 504, a rectangular opening 506 or a circular opening 508 can be used. The rectangular opening shown in FIG. 5(c) is merely a limited expansion of one of the slots 152. In addition, multiple combinations of these openings can be used in concert. The distinguishing characteristic of these openings is that they allow the plasma source-coil to capacitively ignite the plasma while maintaining the source-coil impedance as a near constant. As such, they will be placed near regions of the source-coil at large voltages with respect to ground rather than only in regions where the source-coil has near ground voltages. Openings may also be placed in proximity to large permittivity dielectrics that will help to reliably ignite the plasma by causing a larger fraction of the voltage drop to occur in the plasma chamber 110. These openings are generally expected to have a static size so that the source-coil input impedance remains stable, but dynamically variable slot sizes can be used as well.

FIGS. 6(a) through 6(d) show several different examples of a Faraday shield that can allow enough capacitive coupling for plasma ignition while preserving the transmission line source impedance as a near constant for a substantially cylindrical configuration. For example, an aperture 602 can be placed between anti eddy-current slots 652 to allow plasma ignition. An expanded slot 604 can do the same thing. The expanded slot or aperture can have almost any shape, but is shown as rectangular in 602, rounded rectangular in 604 and circular in 606. The central opening 502 in FIG. 5 corresponds to the central aperture 608 in FIG. 6, and the reduction in anti eddy-current slots 510 in FIG. 5 corresponds to the reduction of slots 610 in FIG. 6.

Figure 7A:
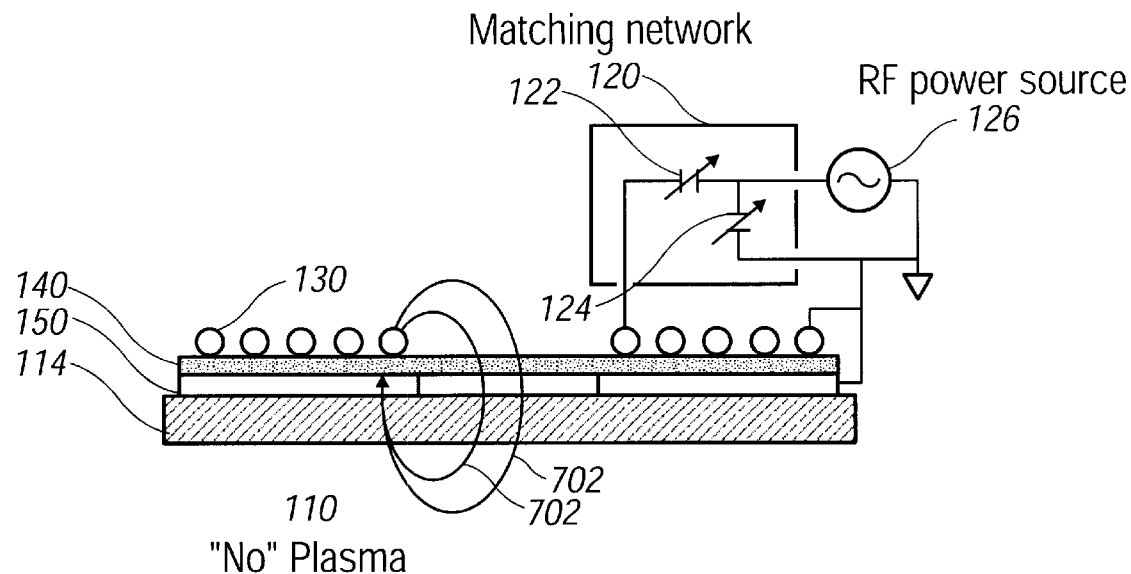
FIGS. 7(*a*) and 7(*b*) schematically show how capacitive coupling can be important when the plasma density is small (during plasma ignition) and become negligible when the inductive coupling to the plasma becomes dominant.
Figure 7B:
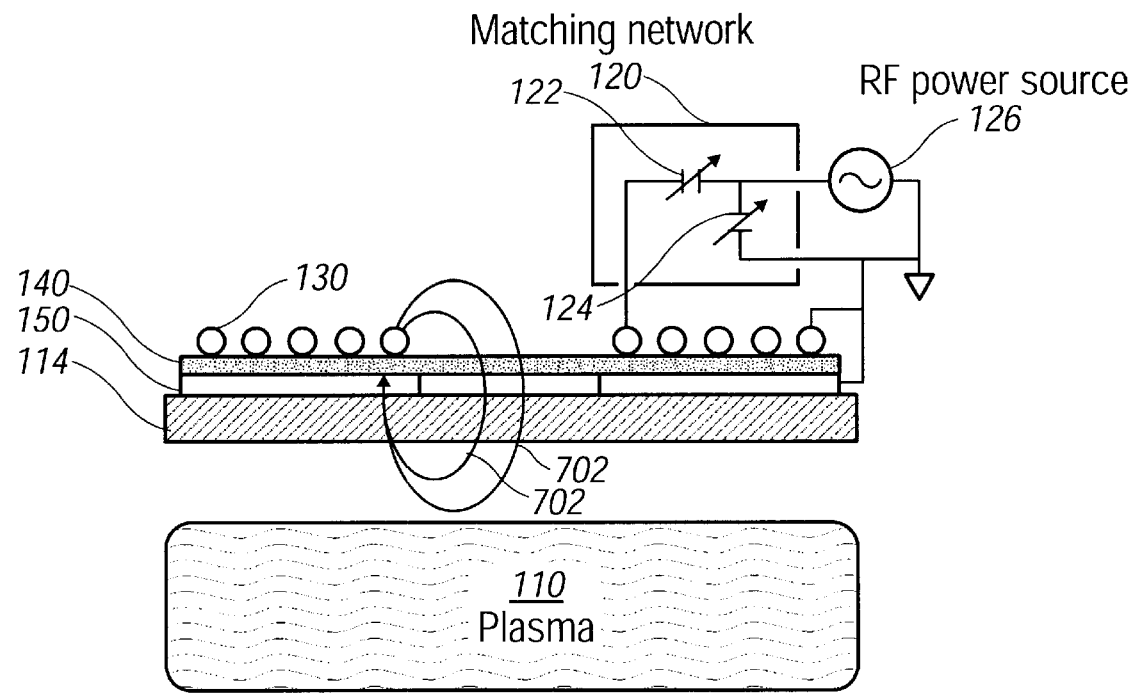

FIGS. 7(a) and 7(b) schematically show how capacitive coupling between the source-coil 130 and plasma region 110 can be important when the plasma density is small (during plasma ignition) and become negligible when the inductive coupling to the plasma becomes dominant. In FIG. 7(a), with no plasma present, the voltage on the source-coil establishes electric fields 702 which can penetrate into the plasma region 110 through a calibrated aperture (502 etc.) in the Faraday shield 150. With no plasma present, the field penetration can be substantial because the conductivity of the vacuum is low. This is illustrated in FIG. 7(a). Once the plasma density becomes significant, the electrons of the plasma act to expel all electric fields below the plasma frequency. As a result (FIG. 7(b)), the electric fields established by the voltage on the source-coil are also expelled from the plasma region and pushed primarily inside the dielectric window 114.

FIG. 8(a) through 8(e) show (using transmission line modelling) how the Faraday shield 150 acts to stabilize the source-coil 130 input-impedance. The source-coil 130 acts as a transmission-line when driven with RF currents. The characteristic impedance of that source-coil transmission-line is unstable without a Faraday shield because the plasma conductivity changes and the proximity of the plasma to the source-coil changes. These have a large influence on the characteristic impedance. The impedance is stable with a Faraday shield because the Faraday shield has a fixed conductivity and proximity to the source-coil. To illustrate these effects, FIG. 8(a) shows an analog model of a loss-less transmission-line. The model simulates transmission-line behavior well and consists of series inductances and shunt capacitances. The shunt capacitances in the model are determined in large part by the capacitance between individual loops (wires) of the source-coil and ground potential. Ground potential is almost invariably asserted at the chamber walls 102, so FIG. 8(b) illustrates how one might envision the capacitance of the transmission-line model to be established by the chamber. This capacitance should be small since the chamber is far from the source-coil loops. Since plasma has a finite conductivity and acts to expel electric fields generated by the coil, the formation of plasma in the chamber significantly affects the capacitance between the source coil loops and ground. This is illustrated in FIG. 8(c) where a capacitance between the source coil loops and the plasma is placed in series with a capacitance between the plasma and ground. The series combination of these capacitances is significantly larger than the capacitance without plasma and consequently changes the transmission-line characteristics substantially. A Faraday shield 150 can stabilize the transmission-line characteristics of the source-coil as shown in FIGS. 8(d) and 8(e). The shunt capacitance of FIG. 8(a) is now dominated by the capacitance between the source-coil and Faraday shield instead of the chamber ground. The small capacitance to the chamber ground can still exist through the Faraday shield aperture, but adds an insignificant capacitance. When the plasma is started, the large capacitance to the Faraday shield is unaffected and even though the small capacitance to the chamber ground increases, it does not cause any substantial change in the source-coil's transmission-line characteristics.

Figure 9A:
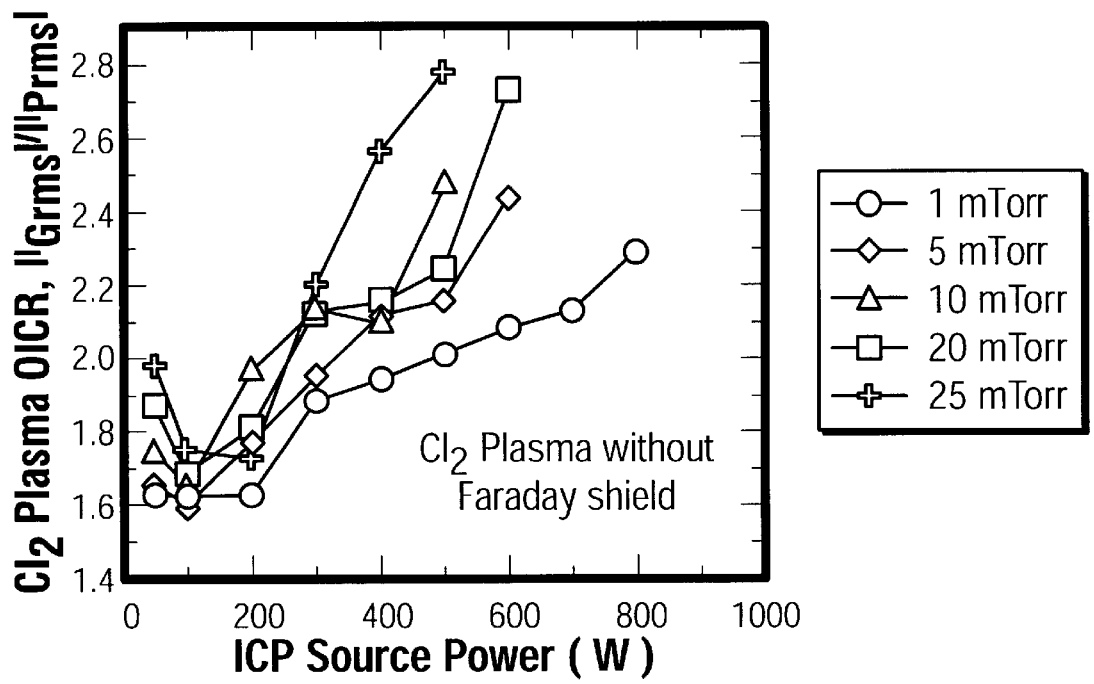
FIGS. 9(a) and 9(b) show Output-current to Input-Current magnitude Ratios (OICRs) as a function of ICP source power for (a) chlorine and (b) argon plasmas, WITHOUT the Faraday shield/dielectric spacer assembled to the source coil.
Figure 9B:
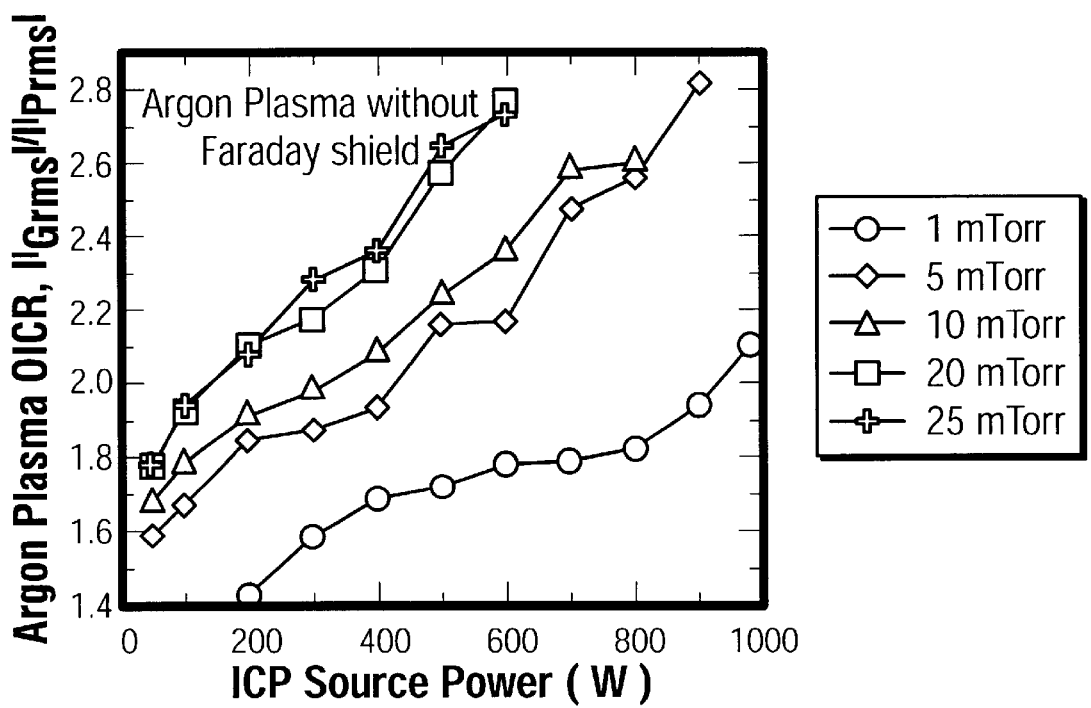
Figure 10:
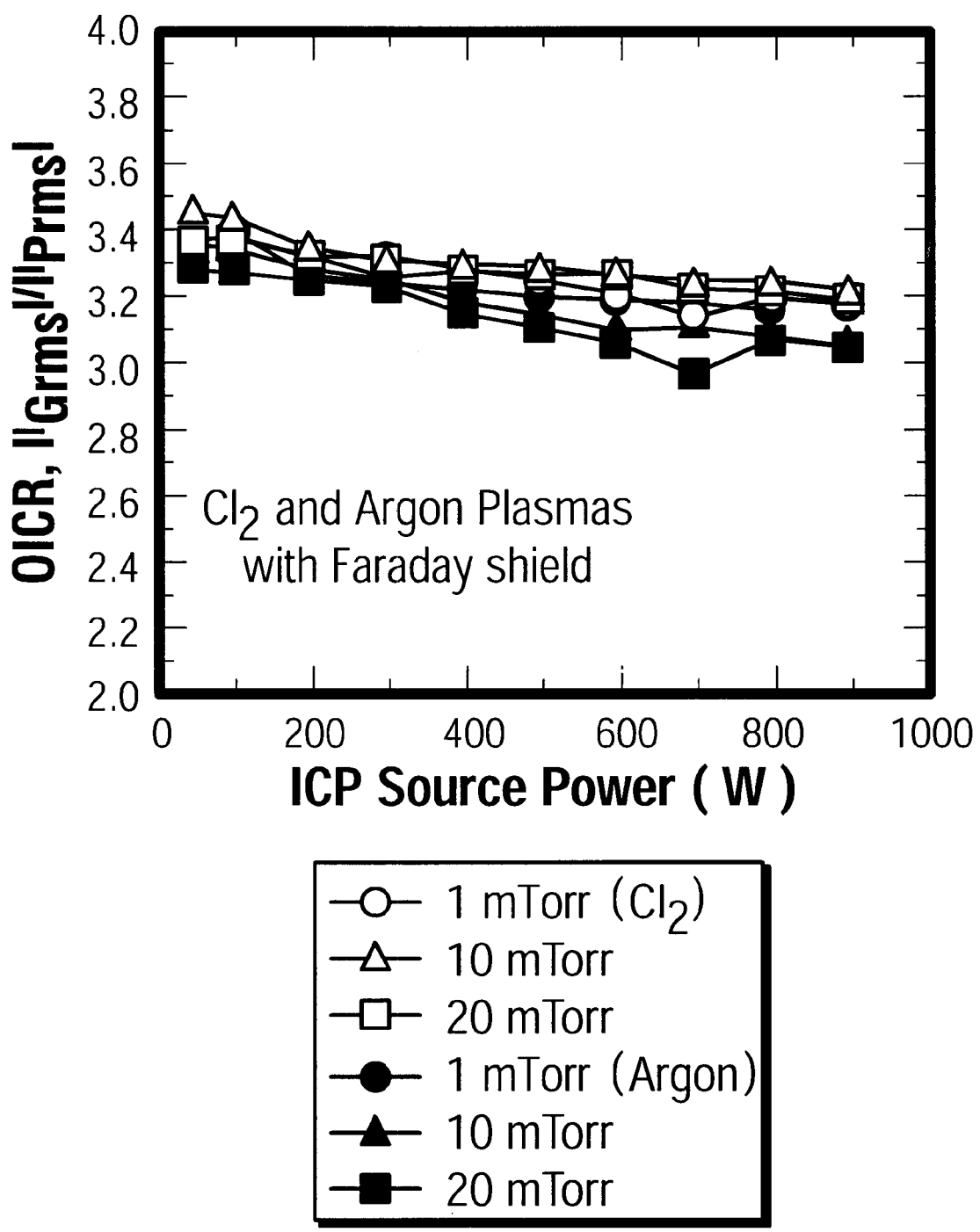
FIG. 10 shows the Output-current to Input-Current magnitude Ratio (OICR) as a function of ICP source power for chlorine and argon plasmas with the Faraday shield/dielectric spacer assembled to the source coil.

FIGS. 9(a), 9(b), and 10 show data taken from Argon and Chlorine plasmas illustrating the input-impedance stability afforded by a properly designed source-coil 130/dielectric spacer 140/Faraday shield 150 assembly. The ICP source voltage and currents at both the powered (input) and ground leads were measured at different powers and pressures for argon and chlorine plasmas without and with the Faraday shield. The voltage and currents were similar for both argon and chlorine discharges under the same conditions (Khater 2001). The voltage generally increased with ICP source power as expected. It had a small dependence on pressure with the highest value occurring at the lowest pressure (1 mTorr). This is mainly due to an increase in the source current, which is necessary to sustain the discharge as the pressure is decreased (Piejak 1992, Godyak 1995). The impedance of the source remained inductive and the phase difference between the current at the powered lead of the source-coil, $I_{Prms}$, and the voltage at the powered lead ranged from 80° to 90° for different plasma conditions. In addition, the current standing wave on the source did not obtain a current node.

Since there was no current node on the source-coil and the source current is largest at the grounded lead, $I_{Grms}$, the Output to Input Current Ratio (OICR) can be defined as:

$$OICR=|I_{Grms}|/|I_{Prms}|$$

The source-coil OICR for chlorine and argon plasmas without the Faraday shield are shown in FIGS. 9(a) and 9(b) as a function of ICP source power and pressure. The OICR increased by a factor as large as 2 with source power and discharge pressure for both chlorine and argon plasmas. Such increase in the OICR indicates a change in the impedance of the source, which is coupled to changes in the plasma parameters. FIGS. 9(a)/9(b) also show that the OICR is dependent on the gas type, where the OICR for argon plasma is smaller at lower pressures. Changes in the OICR result in changes in the electromagnetic field profile generated by the source, which affects the power deposition symmetry to the plasma as well as plasma processing uniformity (Jaeger 1995, Kushner 1996, Khater 2000). As a result, it is difficult to stabilize the plasma uniformity for a fixed ICP source geometry as the plasma conditions are varied.

FIG. 10 shows the Output-current to Input-Current magnitude Ratio (OICR) as a function of ICP source power for chlorine and argon plasmas with the Faraday shield/dielectric spacer assembled to the source coil. In these experimental results, the present inventors installed a Faraday shield between the quartz window and the ICP source. The shield and the source were separated by a dielectric spacer made out of Teflon (see FIG. 1). In addition to reducing capacitive coupling and window sputtering, the Faraday shield acts as the second conductor in a transmission line system with the source as the first conductor and the spacer as the dielectric medium between them. In this manner the transmission line parameters of the ICP source (as well as input impedance) are fixed by the Faraday shield and are no longer dependent on plasma conductivity variations. The transmission line parameters can be further controlled by adjusting the dielectric spacer properties and structure to optimize the power deposition symmetry and plasma uniformity.

The RMS current at both leads with the Faraday shield increased compared to that measured without the shield. This was expected for equal source input powers. The grounded lead current increased more than the powered lead current as well. This causes an increased OICR and is mainly due to larger capacitance to the shield. Despite the larger OICR with the Faraday shield, a properly designed source can generate electromagnetic fields and plasmas of high symmetry and uniformity. The OICR is plotted in FIG. 10 for chlorine and argon plasmas at a variety of powers and pressures. The OICR is almost completely independent of the plasma conditions when using the Faraday shield indicating that the source electrical properties have been decoupled from the plasma and that its impedance is stabilized. It is about the same for both argon and chlorine plasmas, at pressures between 1 and 20 mTorr and RF powers between 100 and 1000 Watts. It was observed that the phase difference between the voltage and current at either lead of the source remained nearly constant for all plasma conditions and that the matching capacitors (122 and 124 in FIG. 1) required minimal changes. All of these were taken as indications that the Faraday shield stabilized the source-coil input-impedance and standing wave pattern. As a result, the symmetry of the fields generated by the source-coil assembly will also be stabilized when the shield is used. There are some small variations in the OICR plotted in FIG. 10. It is expected that these were caused by a smaller interaction between the source and the plasma through the center hole 502 in the Faraday shield (FIG. 5(a)).

Definitions

Following are short definitions of the usual meanings of some of the technical terms which are used in the present application. (However, those of ordinary skill will recognize whether the context requires a different meaning.) Additional definitions can be found in the standard technical dictionaries and journals.

Faraday shield: a conductive layer which serves to block electro-static fields.

Impedance: a complex number which expresses both resistance (the real part) and reactance (the imaginary part).

Transmission line: a conductor which is long enough, in relation to the electrical wavelength it carries, that substantial phase shifts occur within the length of the line. The electrical parameters of the transmission line are expressed as distributed resistance, inductance and capacitance (i.e. resistance etc. per unit length). The distributed resistance, inductance and capacitance will define a characteristic impedance of the transmission line.

Impedance matching: In an RF circuit, power will not be efficiently transmitted between elements having different characteristic impedances. Where such an impedance mismatch appears, some of the power will be reflected back to the source. This reflected power will produce a standing wave, which may have an undesirably high magnitude. The degree of mismatch can be measured by Voltage Standing Wave Ratio (VSWR) or by current standing wave ratio. To avoid or minimize the effects of mismatch, it is common to use an impedance matching circuit, which transforms the RF impedances to reduce or eliminate mismatch. In conventional plasma processing systems, the impedance matching circuit operates automatically, to track the wide variations in impedance caused by changes in the plasma conditions.

Inductively Coupled Plasma (ICP): a type of plasma source which uses predominantly inductive coupling (rather than capacitive coupling) to electrically drive a plasma with RF power.

According to at least some disclosed embodiments, there is provided: A method for plasma processing, comprising the actions of: a) driving a coil with an RF power source to thereby initiate a glow discharge in a process chamber, using capacitive coupling; b) and thereafter inductively coupling power into said glow discharge from said coil; wherein the impedance of said coil does not change by more than 3:1 between said steps a) and b).

According to at least some disclosed embodiments, there is provided: An inductively-coupled-plasma reactor system, comprising: an RF power source; a driver coil which is inductively coupled to a process chamber; and an impedance-matching stage connecting said power source and said coil; wherein no component of said system provides impedance matching over a range of impedance magnitudes of more than 3:1.

According to at least some disclosed embodiments, there is provided: A plasma processing station, comprising: a chamber; and a coil which is electromagnetically coupled to said chamber through a Faraday shield and through a nonuniform dielectric layer; wherein the nonuniformity of said dielectric layer is positioned to increase the net uniformity of plasma generated in said chamber.

According to at least some disclosed embodiments, there is provided: A method for plasma processing, comprising the actions of: driving a coil with an RF power source through a matching network to symmetrically energize a plasma which provides an electrical load to said coil, while stabilizing the input impedance of said coil, independently of said matching network, to thereby maintain the input impedance of said coil independent of variations in the conditions of said plasma and maintain symmetry in the energizing of said plasma independent of variations in the conditions of said plasma.

According to at least some disclosed embodiments, there is provided: A plasma source structure, comprising in combination a Faraday shield and driver coil and dielectric, which are aligned, for a known standing-wave condition of said coil, such that nonuniformity of current magnitude on said coil is compensated by nonuniform geometry of said coil and/or said dielectric and/or said Faraday shield, to provide improved uniformity of power deposition into the plasma.

According to at least some disclosed embodiments, there is provided: A method for plasma processing, comprising the actions of: driving a coil, which is electromagnetically coupled to a process chamber through a Faraday shield and through a nonuniform dielectric layer, with RF power, to thereby energize a glow discharge in the process chamber; wherein the nonuniform thickness of said dielectric layer is positioned to increase the net uniformity of plasma generated in the chamber.

According to at least some disclosed embodiments, there is provided: A plasma processing station, comprising: a chamber; and a coil which is electromagnetically coupled to said chamber and is operatively connected to be driven by an RF power supply at a frequency which induces at least one current node on said coil.

According to at least some disclosed embodiments, there is provided: A method for plasma processing, comprising the actions of: driving a coil which is electromagnetically coupled to a process chamber, with RF power at a frequency which induces at least one current node on said coil, to thereby energize a glow discharge in the process chamber.

According to at least some disclosed embodiments, there is provided: A method for plasma processing, comprising the actions of: initiating a glow discharge in a process chamber, using capacitive coupling, through at least one aperture in a Faraday shield, to a coil which is connected to an RF power source; and thereafter inductively coupling power into said glow discharge from said coil through said Faraday shield, while said glow discharge blocks said capacitive coupling through said aperture.

According to at least some disclosed embodiments, there is provided: A method for pulsed plasma processing, comprising the actions of, at each pulse: igniting a plasma in a chamber, using capacitive coupling, through at least one aperture in a Faraday shield, to a coil which is connected to an RF power source; and thereafter inductively driving said plasma using said coil, while said plasma blocks said capacitive coupling through said aperture.

According to at least some disclosed embodiments, there is provided: An inductively-coupled-plasma reactor system, comprising: an RF power source; an impedance-stabilized driver coil which is inductively coupled to a process chamber through a Faraday shield, and connected to receive pulsed power from said RF power source; and an automatic impedance-matching stage, connecting said power source and said coil, which has a response time slower than the time between pulses of said pulsed power.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Many modifications have been illustrated in the various configurations illustrated in the subparts of FIGS. 2, 3, 4, 5, 6, and 7. It will also be recognized that these modifications and embodiments can be used in combination with each other, so that a very large number of total possibilities have already been indicated.

The TLICP source coil 130 is illustrated with a complex Khater/Overzet/Cherrington geometry like that described in U.S. Pat. No. 6,028,285, but many other source coil geometries are possible. In particular, those skilled in the art will recognize that all manner of two-dimensional geometries can be used (including but not limited to planar geometries; e.g. concentric circle or helical or multi-helix geometries), as well as hemispherical geometries, domed geometries, and cylindrical geometries can be used.

For another example, the preferred class of embodiments uses an aperture in the shield to retain a small amount of capacitive coupling for igniting the plasma. However, the aperture is not necessary in all embodiments; for example, laser or microwave ignition could be used instead.

In another alternative, part of the coil can be tapered line if desired, to provide a graduated impedance transformation and hence a graduated current.

In embodiments which use nonuniform dielectric (to tailor the uniformity of the plasma power deposition profile), the nonuniformity of the dielectric can be achieved not only by nonuniform thickness, but also by different materials, including materials of different permittivities, and also including vacuum, air or other gasses, and even liquids (e.g. connected in a flow through a heat exchanger).

The complete plasma processing stations using the present invention do not have to be simple one-chamber systems like that shown in the drawing. The disclosed inventions are also fully applicable to and advantageous in multistation modules.

The disclosed inventions are not applicable only to plasma etching methods and systems, but also to methods and systems for plasma-assisted deposition, implantation, and other plasma processes.

The disclosed inventions are particularly advantageous in pulsed plasma systems. The disclosed impedance-stabilized configurations are especially advantageous in such systems, since the rapid changes in plasma state do not have to be tracked by adaptations of the automatic impedance-matching network. Indeed, the impedance-matching network can now be specified to have both a more limited bandwidth and more limited range than was previously possible.

The disclosed inventions are not applicable only to plasma methods and systems used in microfabrication, but can also be adapted to methods and systems for plasma-assisted processing of large articles.

Those skilled in the art will understand that Maxwell's equations imply that the magnitude of electromagnetic fields driven by the coil will necessarily vary within the total driven volume. Thus the uniformity or symmetry sought, in design and selection of plasma sources, is typically a requirement of (e.g. for a planar coil) circumferential (or "azimuthal") uniformity, while allowing some known smooth gradation in the radial and axial directions. The disclosed techniques for increasing uniformity can be used to achieve various desired distributions of RF power deposition. For example, depending on the relation between workpiece geometry and source geometry, a system designer might wish to modify the radial distribution of power density, while keeping the circumferential distribution perfectly uniform. The disclosed optimizations can be applied to such specifications if desired.

The following publications provide additional detail regarding possible implementations of the disclosed embodiments, and of modifications and variations thereof, and the predictable results of such modifications, and are all hereby incorporated by reference: R. Piejak, V. Godyak, and B. Alexandrovich, Plasma Sources Sci. Technol. 1, 179 (1992); V. Godyak, R. Piejak, and B. Alexandrovich, Plasma Sources Sci. Technol. 3, 169 (1994); J. Gudmundsson, and M. Lieberman, Plasma Sources Sci. Technol. 6, 540 (1997); J. Gudmundsson, and M. Lieberman, Plasma Sources Sci. Technol. 7, 83 (1998); I. El-Fayoumi and I. Jones, Plasma Sources Sci. Technol. 6, 201 (1997); I. El-Fayoumi and I. Jones, Plasma Sources Sci. Technol. 7, 179 (1998); E. Jaeger, L. Berry, J. Tolliver, and D. Batchelor, Phys. Plasmas 2, 2597 (1995); M. Kushner, W. Collison, M. Grapperhaus, J. Holland, and M. Barnes, J. Appl. Phys. 80, 1337 (1996); A. Lamm, J. Vac. Sci. Technol. A 15, 2615 (1997); Y. Wu and M. Lieberman, Plasma Sources Sci. Technol. 9, 210 (2000); M. Khater and L. Overzet, Plasma Sources Sci. Technol. 9, 545 (2000); M. Hopkins and W. Graham, Rev. Sci. Instrum. 57, 2210 (1986); V. Godyak, R. Piejak, and B. Alexandrovich, Plasma Sources Sci. Technol. 4, 332 (1995); S. Shinohara, S. Takechi, and Y. Kawai, Jpn. J. Appl. Phys. 35, Part 1, 4503 (1996); M. Khater and L. Overzet, J. Vac. Sci. Technol A 19, 785 (2001); Grill, Cold Plasma in Materials Fabrication (1994); Chapman, Glow Discharge Processes; Coburn, Plasma etching and reactive ion etching (1982); Handbook of Plasma Processing Technology (ed. Rossnagel); Lieberman, Principles of Plasma Discharges and Materials Processing (1994); Plasma Processing (ed. Dieleman et al. 1982); and Plasma Etching (Manos and Flamm, 1989). All of these publications are hereby incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A method for plasma processing, comprising the actions of:
    a) driving a coil with an RF power source to thereby initiate a glow discharge in a process chamber, using capacitive coupling;
    b) and thereafter inductively coupling power into said glow discharge from said coil;
    wherein the impedance of said coil does not change by more than 3:1 between said steps a) and b).

2. The method of claim 1, wherein said dielectric layer consists of at least one solid body.

3. The method of claim 1, wherein said coil is electromagnetically coupled to said chamber through a dielectric layer of nonuniform thickness, through a Faraday shield, and through a vacuum-sealed dielectric chamber wall.

4. An inductively-coupled-plasma reactor system, comprising:
    an RF power source;
    a driver coil which is inductively coupled to a process chamber; and
    an impedance-matching stage connecting said power source and said coil;
    wherein no component of said system provides impedance matching over a range of impedance magnitudes of more than 3:1.

5. The system of claim 4, wherein said coil is electromagnetically coupled to said chamber through a dielectric layer of nonuniform thickness and through a Faraday shield.

6. The system of claim 4, wherein said coil is electromagnetically coupled to said chamber through a dielectric layer of nonuniform thickness, through a Faraday shield, and through a vacuum-sealed dielectric chamber wall.

7. A plasma processing station, comprising:
    a chamber; and
    a coil which is electromagnetically coupled to said chamber through a Faraday shield and through a dielectric layer having a first region having a first dielectric material and a second region having a second dielectric material;
    wherein the first and second regions are positioned to increase the net uniformity of plasma generated in said chamber.

8. The station of claim 7, wherein said Faraday shield is also separated from the interior of said chamber by a dielectric vacuum-sealed wall.

9. The station of claim 7, wherein said dielectric layer consists of at least one solid body.

10. The station of claim 7, wherein said Faraday shield includes an aperture under a portion of said coil which does not include any voltage node on said coil.

11. The station of claim 7, wherein said dielectric layer has nonuniform thickness.

12. The station of claim 7, wherein the nonuniformity of said dielectric layer includes cutouts.

13. The station of claim 7, wherein said dielectric layer includes multiple different materials.

14. A method for plasma processing, comprising the actions of:
    driving a coil with an RF power source through a matching network to symmetrically energize a plasma which provides an electrical load to said coil, while stabilizing the input impedance of said coil, independently of said matching network, to thereby maintain the input impedance of said coil independent of variations in the conditions of said plasma and maintain symmetry in the energizing of said plasma independent of variations in the conditions of said plasma.

15. The method of claim 14, wherein said coil is electromagnetically coupled to said chamber through a dielectric layer of nonuniform thickness and through a Faraday shield.

16. A plasma source structure, comprising in combination a Faraday shield and driver coil and dielectric, which are aligned, for a known standing-wave condition of said coil, such that nonuniformity of current magnitude on said coil is compensated by nonuniform geometry of said coil and/or said dielectric and/or said Faraday shield, to provide improved uniformity of power deposition into the plasma.

17. The source structure of claim 16, wherein said coil has an approximately planar geometry.

18. The source structure of claim 16, wherein said coil has a Khater/Overzet/Cherrington geometry.

19. The source structure of claim 16, wherein said dielectric has a nonuniform thickness.

20. The source structure of claim 16, wherein said coil is electromagnetically coupled to said chamber through said dielectric, through said Faraday shield, and through a vacuum-sealed dielectric chamber wall.

21. A method for plasma processing, comprising the actions of:
driving a coil,
which is electromagnetically coupled to a process chamber through a Faraday shield and through a dielectric layer having a first region having a first thickness and a second region having a second thickness,
with RF power,
to thereby energize a glow discharge in the process chamber;
wherein the first and second regions of said dielectric layer are shaped and positioned to increase the net uniformity of plasma generated in the chamber.

22. The method of claim 21, wherein said Faraday shield is also separated from the interior of said chamber by a vacuum-sealed dielectric wall.

23. The method of claim 21, wherein said coil has an approximately planar geometry.

24. A plasma processing station, comprising:
a chamber; and
a coil which is electromagnetically coupled to said chamber and is operatively connected to be driven by an RF power supply at a frequency which induces at least one current node on said coil.

25. The station of claim 24, wherein said coil has an approximately planar geometry.

26. The station of claim 24, wherein said coil has a Khater/Overzet/Cherrington geometry.

27. The station of claim 24, wherein said coil is electromagnetically coupled to said chamber through a dielectric layer of nonuniform thickness and through a Faraday shield.

28. A method for plasma processing, comprising the actions of:
driving a coil which is electromagnetically coupled to a process chamber,
with RF power at a frequency which induces at least one current node on said coil,
to thereby energize a glow discharge in the process chamber.

29. The method of claim 28, wherein said coil is electromagnetically coupled to said chamber through a dielectric layer of nonuniform thickness and through a Faraday shield.

30. The method of claim 28, wherein said coil is electromagnetically coupled to said chamber through a dielectric layer of nonuniform thickness, through a Faraday shield, and through a dielectric chamber wall.

31. A method for plasma processing, comprising the actions of:
initiating a glow discharge in a process chamber, using capacitive coupling, through at least one aperture in a Faraday shield, to a coil which is connected to an RF power source;
and thereafter inductively coupling power into said glow discharge from said coil through said Faraday shield, while said glow discharge blocks said capacitive coupling through said aperture.

32. The method of claim 31, wherein said Faraday shield also includes anti-eddy-current cutouts.

33. The method of claim 31, wherein said aperture of said Faraday shield is located under a portion of said coil which does not include any voltage node.

34. The method of claim 31, wherein said coil has an approximately Khater/Overzet/Cherrington geometry.

35. The method of claim 31, wherein said coil is electromagnetically coupled to said chamber through a dielectric layer of nonuniform thickness and also through said Faraday shield.

36. The method of claim 31, wherein said coil is electromagnetically coupled to said chamber through a dielectric layer of nonuniform thickness, through said Faraday shield, and through a vacuum-sealed dielectric chamber wall.

37. A method for pulsed plasma processing, comprising the actions of, at each pulse:
igniting a plasma in a chamber, using capacitive coupling, through at least one aperture in a Faraday shield, to a coil which is connected to an RF power source;
and thereafter inductively driving said plasma using said coil, while said plasma blocks said capacitive coupling through said aperture.

38. The method of claim 37, further comprising the action, after each pulse, of allowing a delay which is longer than the free electron lifetime before repeating said action a).

39. The method of claim 37, wherein said Faraday shield also includes anti-eddy-current cutouts.

40. The method of claim 37, wherein said Faraday shield includes an aperture under a portion of said coil which does not include any voltage node.

41. The method of claim 37, wherein said coil has an approximately Khater/Overzet/Cherrington geometry.

42. An inductively-coupled-plasma reactor system, comprising:
an RF power source;
an impedance-stabilized driver coil which is inductively coupled to a process chamber through a Faraday shield, and connected to receive pulsed power from said RF power source; and
an automatic impedance-matching stage, connecting said power source and said coil, which has a response time slower than the time between pulses of said pulsed power.

43. The system of claim 42, wherein said coil is electromagnetically coupled to said chamber through a dielectric layer of nonuniform thickness and through a Faraday shield.

44. The system of claim 42, wherein said coil is electromagnetically coupled to said chamber through a dielectric layer of nonuniform thickness, through a Faraday shield, and through a vacuum-sealed dielectric chamber wall.

* * * * *

UNITED STATES PATENT AND TRADEMARK OFFICE
CERTIFICATE OF CORRECTION

PATENT NO. : 6,459,066 B1  Page 1 of 1
APPLICATION NO. : 09/878156
DATED : October 1, 2002
INVENTOR(S) : Marwan H. Khater et al.

It is certified that error appears in the above-identified patent and that said Letters Patent is hereby corrected as shown below:

Col. 1 lines 4-5 please insert the following statement before the "Cross-Reference to Other Applications" section:

--This invention was made with Government support under grant CTS-9713262, awarded by the National Science Foundation. The Government has certain rights in this invention.--

Signed and Sealed this

Twenty-seventh Day of April, 2010

David J. Kappos
*Director of the United States Patent and Trademark Office*